(12) United States Patent
Hsieh et al.

(10) Patent No.: US 10,475,990 B2
(45) Date of Patent: Nov. 12, 2019

(54) PILLAR CONTACT EXTENSION AND METHOD FOR PRODUCING THE SAME

(71) Applicant: GLOBALFOUNDRIES Singapore Pte. Ltd., Singapore (SG)

(72) Inventors: Curtis Chun-I Hsieh, Singapore (SG); Lup San Leong, Singapore (SG); Wanbing Yi, Singapore (SG); Cing Gie Lim, Singapore (SG); Yi Jiang, Singapore (SG); Juan Boon Tan, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 21 days.

(21) Appl. No.: 15/877,044

(22) Filed: Jan. 22, 2018

(65) Prior Publication Data
US 2019/0229261 A1    Jul. 25, 2019

(51) Int. Cl.
| H01L 43/12 | (2006.01) |
| H01L 43/02 | (2006.01) |
| H01L 43/08 | (2006.01) |
| H01L 27/22 | (2006.01) |

(52) U.S. Cl.
CPC ............ *H01L 43/12* (2013.01); *H01L 27/222* (2013.01); *H01L 43/02* (2013.01); *H01L 43/08* (2013.01)

(58) Field of Classification Search
CPC ..... H01L 27/222; H01L 27/228; H01L 43/02; H01L 43/08; H01L 43/12
See application file for complete search history.

(56) References Cited

U.S. PATENT DOCUMENTS

| 5,461,010 | A | 10/1995 | Chen et al. |
| 5,814,564 | A | 9/1998 | Yao et al. |
| 9,349,772 | B2 | 5/2016 | Yi et al. |
| 9,711,713 | B1* | 7/2017 | Chou ................ H01L 43/08 |
| 2016/0268336 | A1 | 9/2016 | Shum et al. |
| 2017/0092693 | A1 | 3/2017 | Tan et al. |
| 2017/0263850 | A1* | 9/2017 | Ito ..................... H01L 27/228 |
| 2018/0006085 | A1* | 1/2018 | Chuang ............. H01L 27/222 |
| 2018/0123025 | A1* | 5/2018 | Lee ................... H01L 27/222 |

* cited by examiner

*Primary Examiner* — Christine A Enad
(74) *Attorney, Agent, or Firm* — Ditthavong & Steiner P.C.

(57) ABSTRACT

Methods of forming a pillar contact extension within a memory device using a self-aligned planarization process rather than direct ILD CMP and the resulting devices are provided. Embodiments include forming a photoresist layer over a low-K layer formed over an ILD having a first metal layer in a memory region and in a logic region and pillar-shaped conductors formed atop of the first metal layer only in the memory region; forming a trench through the photoresist layer over each pillar-shaped conductor; extending the trench through the low-K layer to an upper surface of each pillar-shaped conductor; forming a second metal layer over the low-K layer, filling the trench entirely; and planarizing the second metal layer until the second metal layer is removed from over the logic region, a pillar contact extension formed atop of each pillar-shaped conductor.

17 Claims, 6 Drawing Sheets

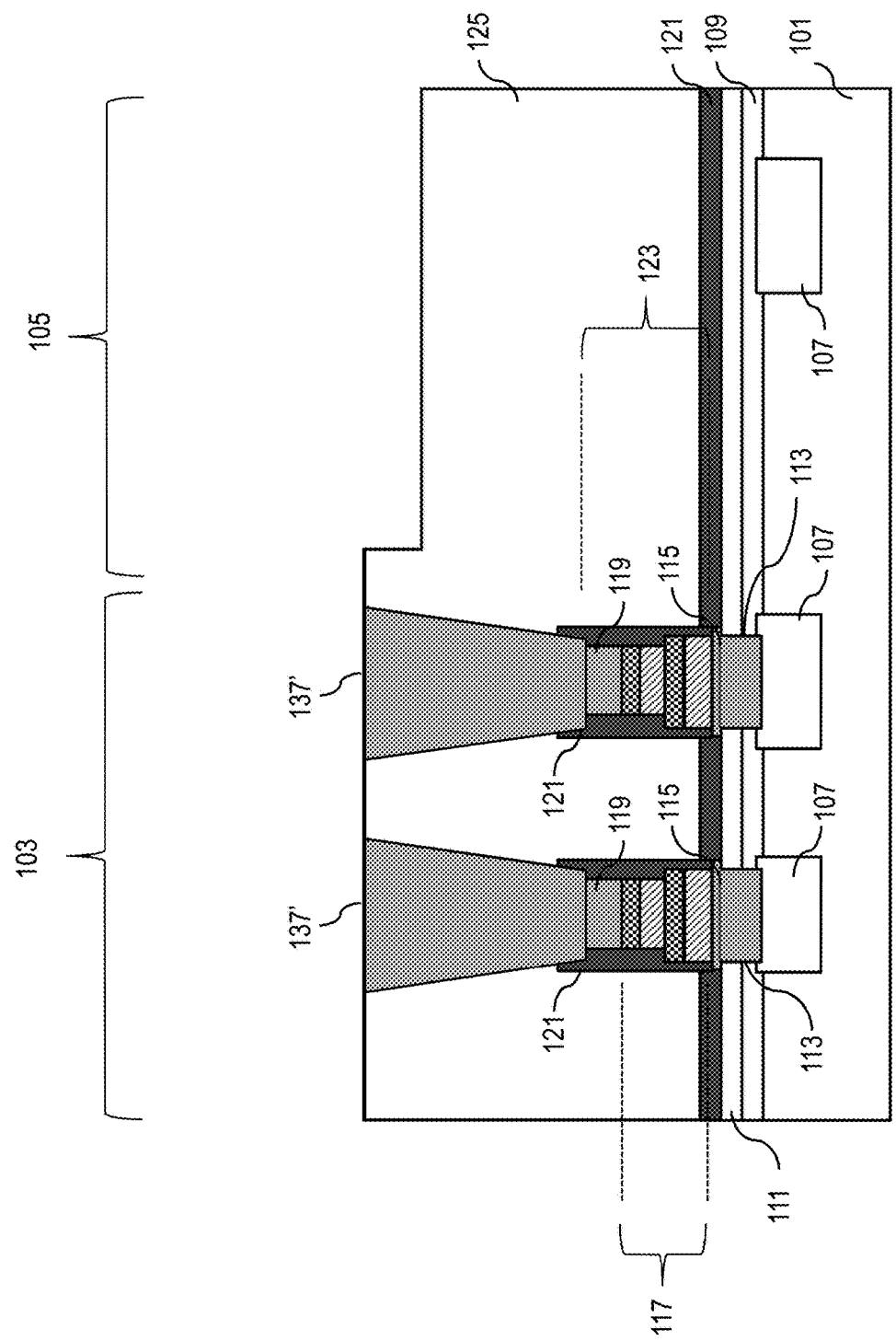

PILLAR CONTACT EXTENSION AND METHOD FOR PRODUCING THE SAME

TECHNICAL FIELD

The present disclosure relates to semiconductor fabrication. In particular, the present disclosure relates to the formation of pillar contact extensions within magnetic random-access memory (MRAM) devices.

BACKGROUND

Memory devices such as MRAM have been continuously scaled down in size to accommodate complex device requirements and low power consumption demands. However, the smaller form factor has also increased the complexity of memory device fabrication. Critical dimensions (CD) of memory cells are smaller compared to normal back-end-of-line (BEOL) process variations. A particular area of challenge faced by manufacturers due to such limitations is extending a pillar contact formed within a memory device to a desired height.

Typically, pillar contacts are difficult to form accurately and consistently into a desired shape or surface type due to limited process margin. For example, etching of a pillar contact, e.g., a memory array or an electrode, may cause sidewall erosion, resulting in tapering of the pillar contact tip instead of formation of a square tip (flat, uniform contact surface). Still further, multiple pillar contacts of a memory device may vary in uniformity due to the height of an applied planarization material overtaking the height of some of the pillar contacts, erosion of the pillar contact shape/contact surface type during chemical-mechanical polishing (CMP), etc. In certain instances, the device manufacturer may apply an additional/reverse mask dielectric material (e.g., a carbon-doped oxide) atop the contacts as a means of reshaping them or extending them to achieve a desired height. However, this requires additional topographic etching to remove the applied mask and further increases the fabrication cost.

A need therefore exists for methodology for cost effectively forming pillar contact extensions within a memory device with minimal fabrication process variation and without direct interlayer dielectric (ILD) CMP, and the resulting device.

SUMMARY

An aspect of the present disclosure is a method of cost effectively forming a pillar contact extension within a memory device using a self-aligned planarization process rather than direct ILD CMP to minimize process variations and to enlarge the process window.

Another aspect of the present disclosure is a device including pillar contact extensions formed through a low-k layer having minimal topographic variation over dense memory regions and adjacent isolated or less dense logic regions.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming a photoresist layer over a low-K layer formed over an ILD having a first metal layer in a memory region and in a logic region and pillar-shaped conductors formed atop of the first metal layer only in the memory region; forming a trench through the photoresist layer over each pillar-shaped conductor; extending the trench through the low-K layer to an upper surface of each pillar-shaped conductor; forming a second metal layer over the low-K layer, filling the trench entirely; and planarizing the second metal layer until the second metal layer is removed from over the logic region, a pillar contact extension formed atop of each pillar-shaped conductor.

Aspects of the present disclosure include planarizing the second metal layer by: CMP with dishing. Other aspects include the CMP being highly selective to the second metal layer compared to the low-K layer. Further aspects include forming the photoresist layer over an oxide layer formed over the low-K layer; extending the trench through the oxide layer; and forming the second metal layer over the oxide layer; and planarizing the second metal layer until the second metal layer and the oxide layer are removed from over the logic region. Another aspect includes a pillar-shaped conductor being a metal tunnel junction (MTJ) structure. Additional aspects include forming a nitride floating cap (NFC) layer and a low temperature oxide (LTO) layer over the low-K layer prior to forming the photoresist layer; and forming the trench through the NFC layer and the LTO layer. Other aspects include forming a second low-K layer over the low-K layer and the second metal layer; and forming a BEOL contact down to at least each pillar contact extension in the memory region and the first metal layer in the logic region through the second low-K layer and the low-K layer, respectively.

Another aspect of the present disclosure is a device including: an ILD with a memory region and a logic region; a metal layer in the memory region and in the logic region; pillar-shaped conductors over the metal layer only in the memory region; a pillar contact extension atop of each pillar-shaped conductor; and a low-K layer over the metal layer and the ILD and surrounding each pillar contact extension, the low-K layer over the memory region and an upper surface of each pillar contact extension being coplanar.

Aspects of the device include a capping layer over the ILD and a portion of the metal layer in the memory region and a portion of the metal layer in the logic region, wherein the metal layer is copper (Cu). Other aspects include a second capping layer over a remaining portion of the metal layer in the logic region. Further aspects include an oxide layer over the capping layer and the second capping layer; and a silicon nitride (SiN) layer over the oxide layer. Another aspect includes an oxide layer over the capping layer; and a SiN layer over the oxide layer. Additional aspects include the pillar-shaped conductor being a MTJ structure and a metal-filled via. Other aspects include a SiN layer along sidewalls of each MTJ structure wherein the pillar-shaped conductor is the MTJ structure and the metal-filled via. Further aspects include the pillar contact extension being tantalum nitride (TaN). Another aspect includes a second low-K layer over the low-K layer and pillar contact extensions; and a BEOL contact at least atop of each pillar contact extension in the memory region and the metal layer in the logic region and through the second low-K layer and the first low-K layer, respectively.

A further aspect of the present disclosure is a method including: forming a photoresist layer over an oxide layer formed over a first low-K layer formed over an ILD having a Cu layer in a memory region and in a logic region and MTJ structures formed atop of the Cu layer only in the memory region; forming a trench through the photoresist layer down to the oxide layer over each MTJ; extending the trench through the oxide layer and the first low-K layer down to an upper surface of each MTJ; forming a TaN layer over the first low-K layer, filling the trench entirely; CMP the TaN layer until the TaN layer and the oxide layer are removed from over the logic region, a TaN pillar contact extension formed atop of each MTJ; forming a second low-K layer over the TaN layer and the first low-K layer; and forming a BEOL contact down to at least each TaN pillar contact extension in the memory region and the Cu layer in the logic region through the second low-K layer and the first low-K layer, respectively.

Aspects of the present disclosure include forming the first low-K layer and the second low-K layer of a hydrogenated oxidized silicon carbon (SiCOH) dielectric film or a similar ILD material. Other aspects include forming a NFC layer and LTO layer over the oxide layer prior to forming the photoresist layer; and forming the trench through the NFC layer and the LTO layer. Further aspects include the CMP being highly selective to the TaN layer compared to the first low-K layer.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIGS. 1A through 1F schematically illustrate cross-sectional views of a process flow for forming a pillar contact extension within a memory device using a self-aligned planarization process rather than direct ILD CMP to minimize process variations and to enlarge the process window, in accordance with exemplary embodiments.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the problem of costly solutions for removing ILD topographic variations over dense memory array regions and adjacent isolated or less dense logic regions attendant upon forming pillar contact extensions in memory devices such as MRAM. In addition, the present disclosure addresses and solves the problem of contact shape and type (topography) uniformity among pillar contacts. The problems are solved, inter alia, by forming a pillar contact extension within a memory device using a self-aligned planarization process rather than direct ILD CMP.

Methodology in accordance with embodiments of the present disclosure includes forming a photoresist layer over a low-K layer formed over an ILD having a first metal layer in a memory region and in a logic region and pillar-shaped conductors formed atop of the first metal layer only in the memory region. A trench is formed through the photoresist layer over each pillar-shaped conductor. The trench is extended through the low-K layer to an upper surface of each pillar-shaped conductor. A second metal layer is formed over the low-K layer, filling the trench entirely; and the second metal layer is planarized until the second metal layer is removed from over the logic region, a pillar contact extension is formed atop of each pillar-shaped conductor.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1A:
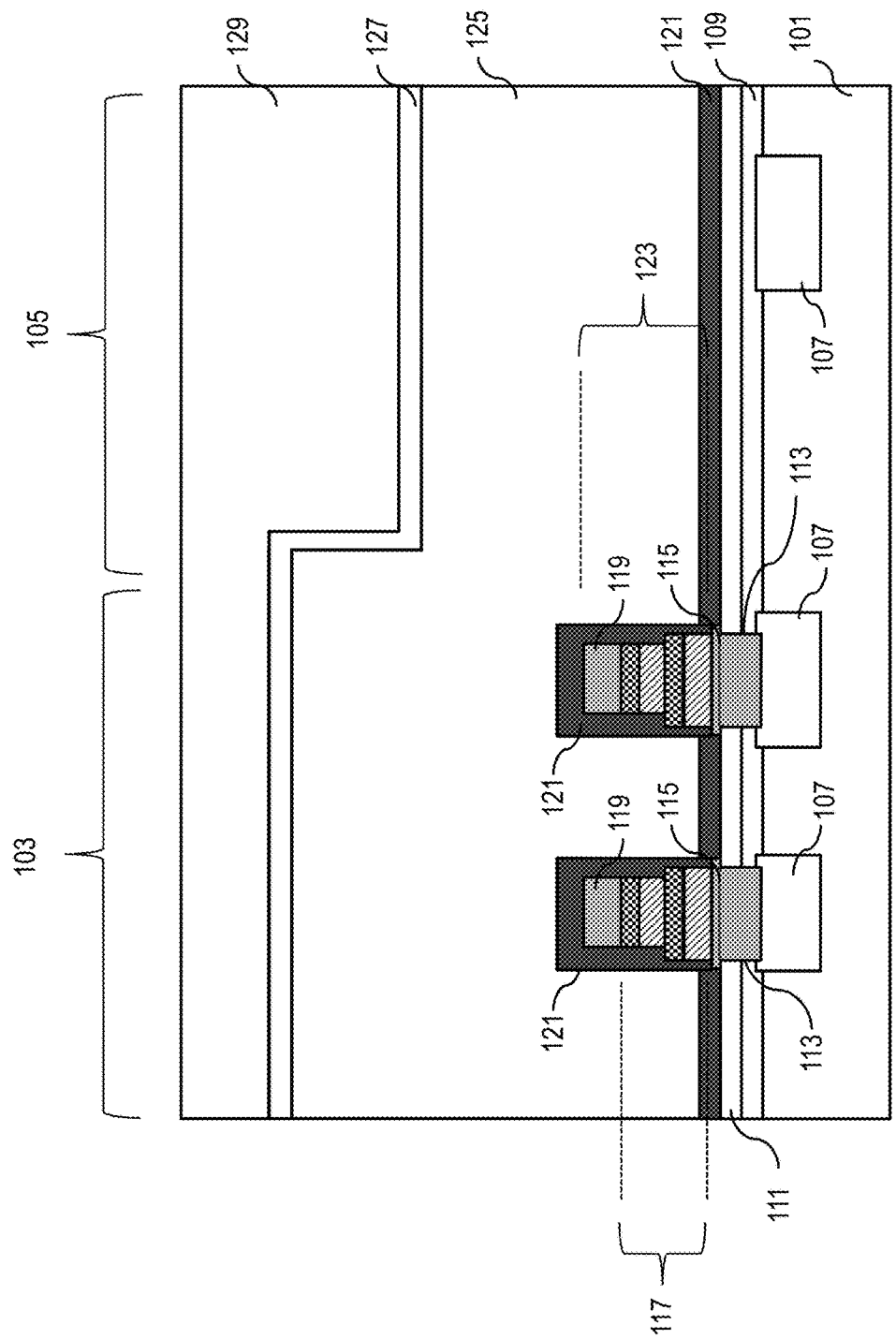

FIGS. 1A through 1F schematically illustrate cross-sectional views of a process flow for forming a pillar contact extension within a memory device using a self-aligned planarization process rather than direct ILD CMP to minimize process variations and to enlarge the process window, in accordance with exemplary embodiments. Referring to FIG. 1A, an ILD 101 is formed, e.g., of a low-K material such as SiCOH or any similar ILD material, with a dense memory region 103 and an adjacent isolated or less dense logic region 105. A metal layer 107, e.g., formed of Cu, is formed in the memory region 103 and the logic region 105. In the instance when the metal layer 105 is formed of Cu, an optional capping layer 109 is formed, e.g., of SiN or Nblok, over the ILD 101 and portions of the metal layer 107. An optional oxide layer 111 may also be formed, e.g., of silicon oxide, over the capping layer 109. Vias (not shown for illustrative convenience) are then formed through the oxide layer 111 and the capping layer 109 in the memory region 103 down to the metal layer 107.

Next, the vias are filled with a conductive metal layer 113, e.g., TaN, over the metal layer 107 in the memory region 103. In the instance where the pillar-shaped conductor or contact is formed in the memory region 103 as a MTJ structure, the metal layer 113 is formed, e.g., of TaN, as an Mvia 113. A bottom electrode (BE) 115 is then formed over the Mvia 113. In this instance, the BE 115 is depicted as extending past the Mvia 113; however, it is contemplated that the sides of the BE 115 may also be flush with the Mvia 113. Next, an MTJ structure 117 (schematically illustrated) is formed over the BE 115 and a TE 119 is then formed, e.g., of TaN, over the MTJ structure 117. Subsequently, a nitride layer 121 is formed, e.g., of SiN or any suitable encapsulation material, over and along sidewalls of the MTJ structure 117, TE 119 and optionally over the oxide layer 111. It is noted that the TE 119 as formed atop the MTJ structure 117 form a memory array 123, e.g., MRAM, wherein the TE 119 serves as the contact point. In another instance, the pillar-shaped conductor or contact may be formed as a single electrode (not shown for illustrative convenience), e.g., adjacent to a MTJ structure 117 in the memory region 103. In that instance, the conductive metal layer 113 may be formed of the same material as the metal layer 107. In particular, no MTJ dummy structures are required to be formed in the logic region 105, which would impact the device resistance capacitance (RC).

Still referring to FIG. 1A, a low-K layer (ILD) 125 is formed, e.g., of a SiCOH dielectric film or a similar ILD material, over the ILD 101. The thickness of the low-K layer 125 in the memory region 103 is proportional to the density and height of the MTJ structures 117 and/or pillar single electrodes. Next, an optional oxide layer (hard mask) 127 may be formed over the low-K layer 125. Thereafter, a photoresist layer 129 is formed, e.g., of a spin-on material, over the oxide layer 127. In one instance, an NFC layer and a LTO layer (both not shown for illustrative convenience) may also be formed over the low-K layer 125 or the oxide layer 127, respectively, prior to forming the photoresist layer 129.

Figure 1B:
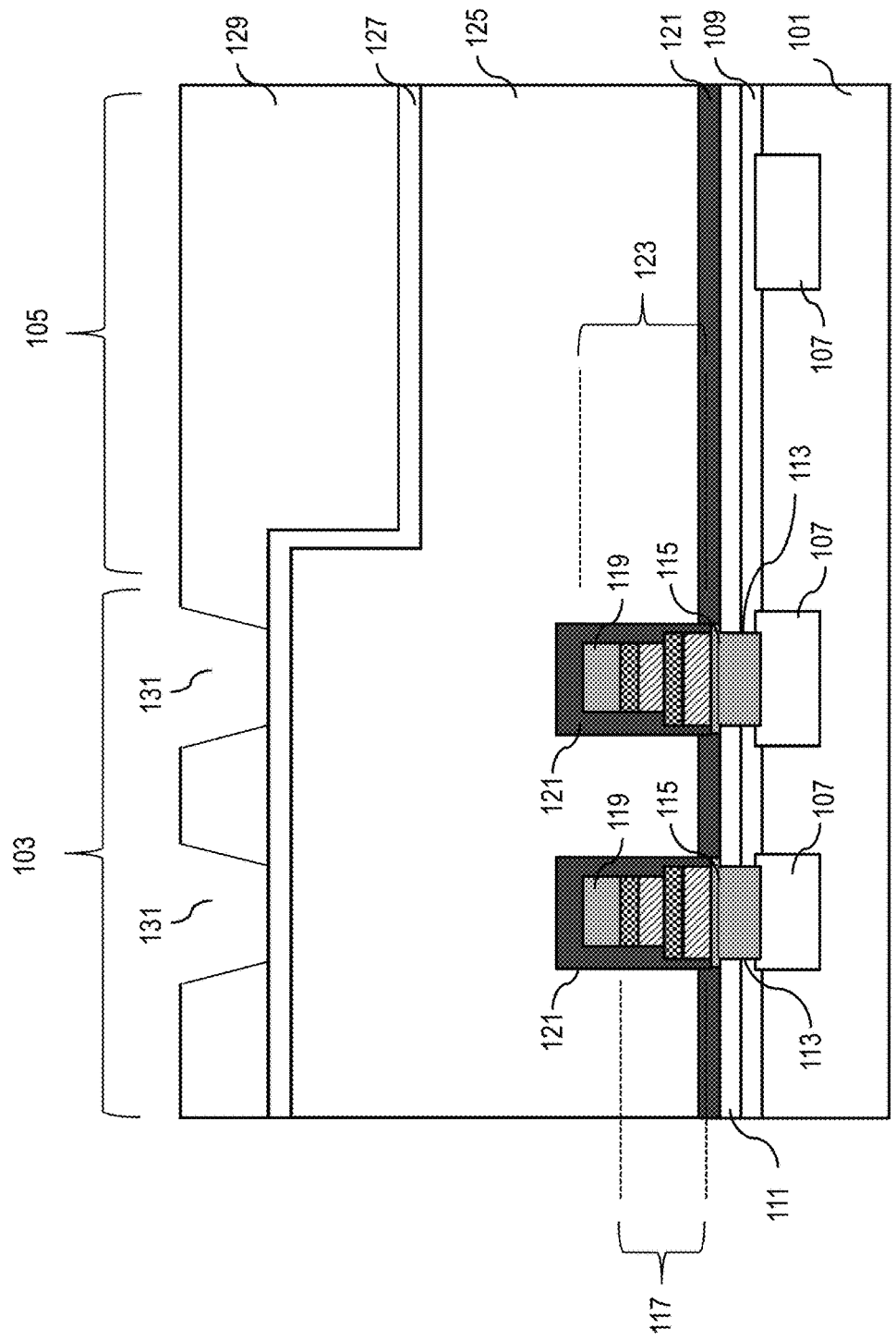

As depicted in FIG. 1B, trenches 131 are formed in the memory region 103, e.g., by photolithography, through the photoresist layer 129 down to the oxide layer 127. The trenches 131 are aligned, e.g., vertically, above each of the respective memory arrays 123. Because no contact extension or dummy MTJ are required in the logic region 105, no trenches 131 are formed in photoresist layer 129 over the logic region 105, thereby reducing design/layout constraints relative to known processes.

Figure 1C:
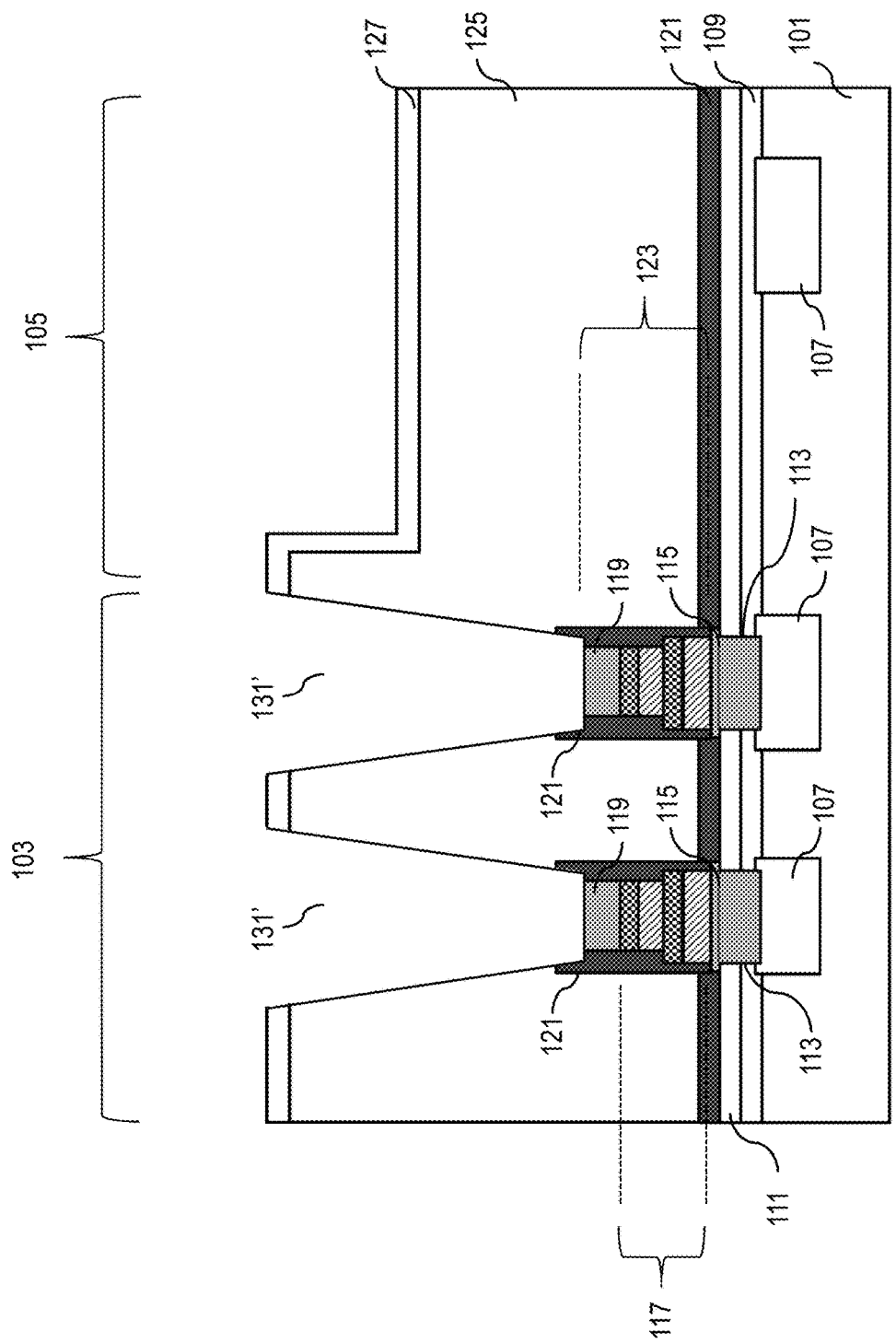

Next, the trenches 131 are extended, e.g., by etching, through the oxide layer 127, the low-K layer 125, and the SiN layer 121, forming trenches 131', as depicted in FIG. 1C. Consequently, the trenches 131' now extend down to the TE 119. Thereafter, the remaining photoresist layer 129 is removed in both the memory region 103 and the logic region 105.

Figure 1D:
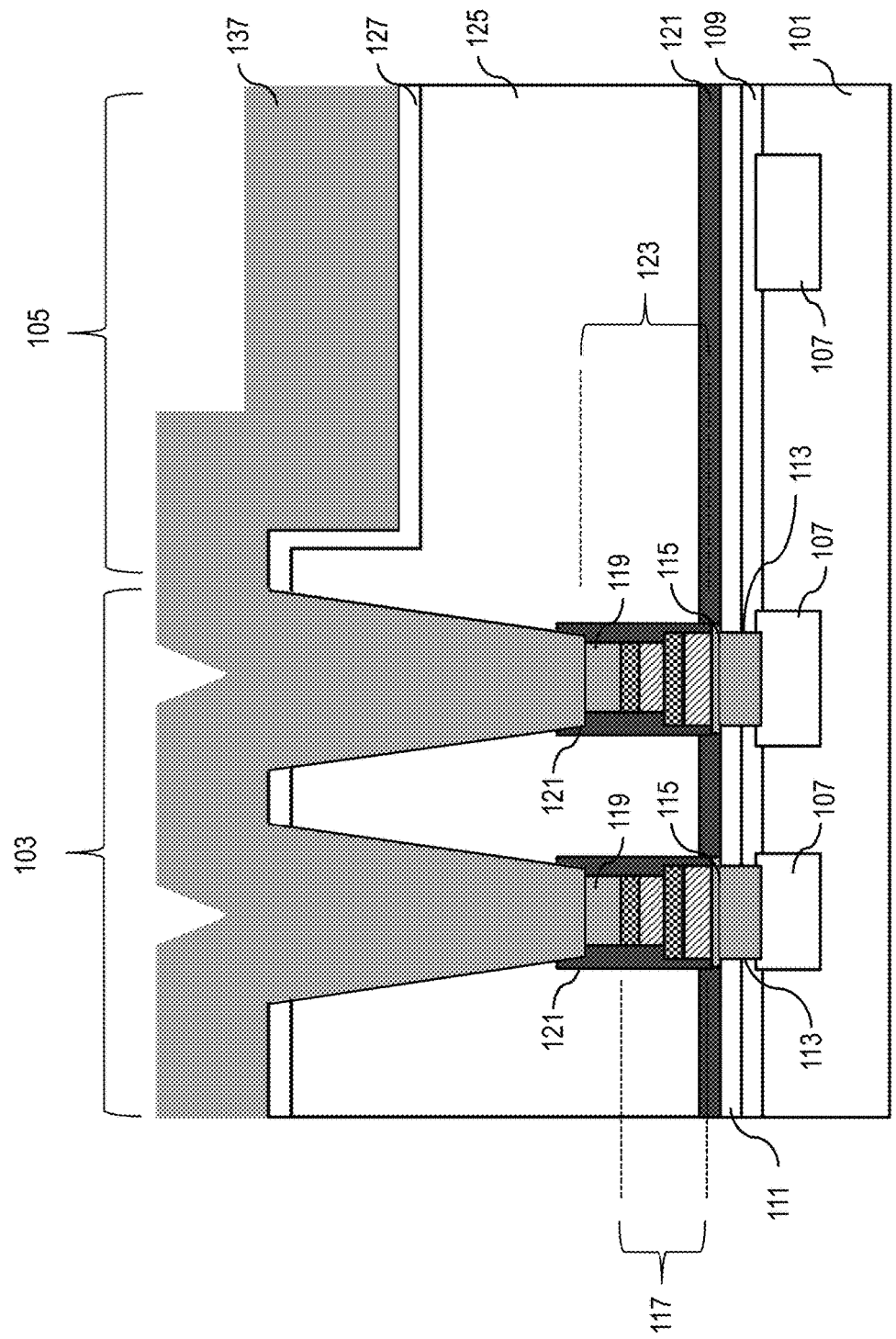

Referring to FIG. 1D, a metal layer 137 is formed, e.g., of TaN, over the remaining oxide layer 127 and into the trenches 131' entirely, thereby interfacing with each TE 119. It is noted that the metal layer 137 may be formed of the same material as the TE 119, the Mvia 113, etc.

As depicted in FIG. 1E, the metal layer 137 is planarized, e.g., by CMP with dishing, until the metal layer 137 and the oxide layer 127 are removed from over the logic region 105, forming pillar contact extensions 137' by self-aligned planarization. Specifically, the CMP is selective to the metal layer 137 compared to the low-K layer 125 and, therefore, the polish rate for the metal layer 137 is much faster than the polish rate for the low-K layer 125. Consequently, a portion of the low-K layer 125 over the memory region 103 is also removed such that the resultant topographic difference across the low-K layer 125 is less than 30 nanometer (nm) and ideally 0 nm. In particular, the amount of erosion and dishing, e.g., 800 angstrom (Å), is sufficient to reduce the resultant MTJ topography, e.g., 600 Å, to a reasonable or manageable level.

Figure 1F:
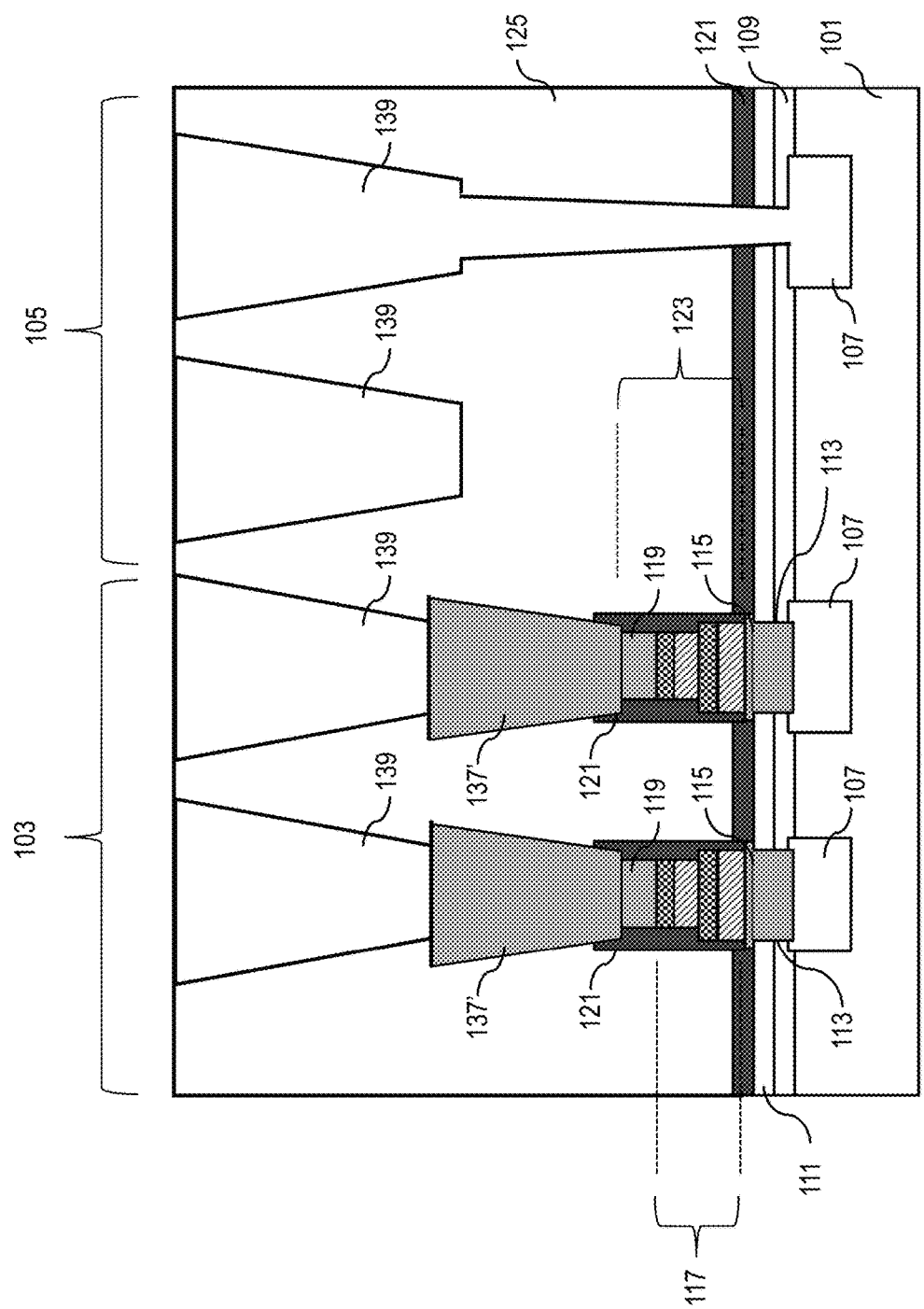

Optionally, Cu BEOL structures 139 are formed within the low-K layer 125 at least over (atop) each electrode extension 137' in the memory region 103 and over (atop) the metal layer 107 in the logic region 105, as depicted in FIG. 1F. Thus, the extended Cu BEOL structures 139 serve as top-level structures to further extend the pillar-shaped conductors or contacts, e.g., memory arrays 123, through the low-K layer 125. The metal layer 107 of the logic region 105 is also extended. Of note, the height of the metal layer 107 in the logic region 105 may vary from the height of the metal layer 107 in the memory region 103 to achieve topological and/or contact shape (e.g., pillar shaped) uniformity.

The embodiments of the present disclosure can achieve several technical effects including forming a conductive extension on top of a pillar contact using self-aligned planarization rather than direct ILD CMP and thus minimize process variations and enlarge the process window so as not to hinder subsequent fabrication steps. Notably, the result of the known Reverse/Additional mask process to remove SiCOH topography can be achieved without the additional cost of the mask. Further, the self-aligned planarization process enables smaller within wafer (WIW) variation, e.g., WIW variations of the planarization is minimized to less than 9.4 nm)and no within die (WID) variation compared to a direct ILD CMP process. Further, since dummy MTJs are not formed in the logic region, there is no impact on the device RC. Devices formed in accordance with embodiments of the present disclosure enjoy utility in various industrial applications, e.g., microprocessors, smart phones, mobile phones, cellular handsets, set-top boxes, DVD recorders and players, automotive navigation, printers and peripherals, networking and telecom equipment, gaming systems, and digital cameras. The present disclosure enjoys industrial applicability in any of various types of semiconductor devices including MRAM.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
    forming a photoresist layer over a first low-K layer formed over an interlayer dielectric (ILD) having a first metal layer in a memory region and in a logic region and pillar-shaped conductors formed atop of the first metal layer only in the memory region;
    forming a trench through the photoresist layer over each pillar-shaped conductor;
    extending the trench through the first low-K layer to an upper surface of each pillar-shaped conductor;
    forming a second metal layer over the first low-K layer, filling the trench entirely;
    planarizing the second metal layer until the second metal layer is removed from over the logic region, a pillar contact extension formed atop of each pillar-shaped conductor;
    forming the photoresist layer over an oxide layer formed over the first low-K layer;
    extending the trench through the oxide layer;
    forming the second metal layer over the oxide layer;
    planarizing the second metal layer until the second metal layer and the oxide layer are removed from over the logic region;
    forming a nitride floating cap (NFC) layer and a low temperature oxide (LTO) layer over the first low-K layer prior to forming the photoresist layer; and
    forming the trench through the NFC layer and the LTO layer.

2. The method according to claim 1, comprising planarizing the second metal layer by:
chemical-mechanical planarization (CMP) with dishing.

3. The method according to claim 2, wherein the CMP is highly selective to the second metal layer compared to the first low-K layer.

4. The method according to claim 1, wherein a pillar-shaped conductor comprises a metal tunnel junction (MTJ) structure.

5. The method according to claim 1, further comprising;
forming a second low-K layer over the first low-K layer and the second metal layer; and
forming a BEOL contact down to at least each pillar contact extension in the memory region and the first metal layer in the logic region through the second low-K layer and the first low-K layer, respectively.

6. A device comprising:
an interlayer dielectric (ILD) with a memory region and a logic region;
a metal layer in the memory region and in the logic region;
pillar-shaped conductors over the metal layer only in the memory region;
a pillar contact extension atop of each pillar-shaped conductor;
a first low-K layer over the metal layer and the ILD and surrounding each pillar contact extension, the first low-K layer over the memory region and an upper surface of each pillar contact extension being coplanar;
a second low-K layer over the first low-K layer and pillar contact extensions; and
a BEOL contact at least atop of each pillar contact extension in the memory region and the metal layer in the logic region and through the second low-K layer and the first low-K layer, respectively.

7. The device according to claim 6, wherein the metal layer comprises copper (Cu), the device further comprising:
a capping layer over the ILD and a portion of the metal layer in the memory region and a portion of the metal layer in the logic region.

8. The device according to claim 7, further comprising:
a second capping layer over a remaining portion of the metal layer in the logic region.

9. The device according to claim 8, further comprising:
an oxide layer over the capping layer and the second capping layer; and
a silicon nitride (SiN) layer over the oxide layer.

10. The device according to claim 7, further comprising:
an oxide layer over the capping layer; and
a SiN layer over the oxide layer.

11. The device according to claim 7, wherein the pillar-shaped conductor comprises a magnetic tunnel junction (MTJ) structure and a metal-filled via.

12. The device according to claim 11, wherein the pillar-shaped conductor comprises the MTJ structure and the metal-filled via, the device further comprising:
a SiN layer along sidewalls of each MTJ structure.

13. The device according to claim 6, wherein the pillar contact extension comprises tantalum nitride (TaN).

14. A method comprising:
forming a photoresist layer over an oxide layer formed over a first low-K layer formed over an interlayer dielectric (ILD) having a copper (Cu) layer in a memory region and in a logic region and metal tunnel junction (MTJ) structures formed atop of the Cu layer only in the memory region;
forming a trench through the photoresist layer down to the oxide layer over each MTJ;
extending the trench through the oxide layer and the first low-K layer down to an upper surface of each MTJ;
forming a tantalum nitride (TaN) layer over the first low-K layer, filling the trench entirely;
chemical-mechanical planarizing (CMP) the TaN layer until the TaN layer and the oxide layer are removed from over the logic region, a TaN pillar contact extension formed atop of each MTJ;
forming a second low-K layer over the TaN layer and the first low-K layer; and
forming a back-end-of-line (BEOL) contact down to at least each TaN pillar contact extension in the memory region and the Cu layer in the logic region through the second low-K layer and the first low-K layer, respectively.

15. The method according to claim 14, comprising forming the first low-K layer and the second low-K layer of a hydrogenated oxidized silicon carbon (SiCOH) dielectric film or a similar ILD material.

16. The method according to claim 14, further comprising:
forming a nitride floating cap (NFC) layer and a low temperature oxide (LTO) layer over the oxide layer prior to forming the photoresist layer; and
forming the trench through the NFC layer and the LTO layer.

17. The method according to claim 14, wherein the CMP is highly selective to the TaN layer compared to the first low-K layer.

* * * * *